United States Patent
Wang

(10) Patent No.: US 9,148,252 B2
(45) Date of Patent: Sep. 29, 2015

(54) METHODS AND SYSTEMS FOR 2-DIMENSIONAL FORWARD ERROR CORRECTION CODING

(71) Applicant: Broadcom Corporation, Irvine, CA (US)

(72) Inventor: Zhongfeng Wang, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 139 days.

(21) Appl. No.: 13/857,871

(22) Filed: Apr. 5, 2013

(65) Prior Publication Data

US 2014/0201604 A1    Jul. 17, 2014

Related U.S. Application Data

(60) Provisional application No. 61/800,425, filed on Mar. 15, 2013, provisional application No. 61/751,757, filed on Jan. 11, 2013.

(51) Int. Cl.
*H04L 1/00* (2006.01)

(52) U.S. Cl.
CPC .................................. *H04L 1/0057* (2013.01)

(58) Field of Classification Search
CPC ..... H04L 1/0057; H04L 1/007; H04L 1/0041; H04L 1/0045; H04L 27/2626; H04L 27/2647; H04L 1/0075; H03M 13/2957; H03M 13/6356; H03M 13/1515; H03M 13/255; H03M 13/1102; H03M 13/6511; H03M 13/1105; H03M 13/15; H03M 13/152; H03M 13/2906; H03M 13/356; H03M 13/618
USPC ............ 714/E11.032, 752, 782, 786, E11.03, 714/758, 784, 792, 800, 776; 375/265; 455/91

See application file for complete search history.

(56) References Cited

U.S. PATENT DOCUMENTS

| | | | |
|---|---|---|---|
| 2005/0160350 A1* | 7/2005 | Dror et al. ..................... | 714/800 |
| 2007/0124652 A1* | 5/2007 | Litsyn et al. ................... | 714/776 |
| 2008/0115036 A1* | 5/2008 | Kuznetsov et al. ........... | 714/758 |
| 2010/0241923 A1* | 9/2010 | Wang et al. ................... | 714/755 |
| 2010/0241926 A1 | 9/2010 | Wang et al. | |

OTHER PUBLICATIONS

Wang, Zhongfeng, "Super-FEC Codes for 40/100 Gbps Networking", IEEE Communications Letters, Oct. 2012, 6p. http://arxiv.org/ftp/arxiv/papers/1202/1202.4664.

* cited by examiner

*Primary Examiner* — Phung M Chung
(74) *Attorney, Agent, or Firm* — Brinks Gilson & Lione

(57) ABSTRACT

A communication system and a method are disclosed. The communication system includes an encoder configured to encode source data and output an encoded frame including a plurality of rows and a plurality of columns. The plurality of rows include a row component code. The plurality of columns include a column component code. The row component code is configured to achieve a lower bit error rate than the column component code in communication channels having a same signal to noise ratio.

20 Claims, 6 Drawing Sheets

METHODS AND SYSTEMS FOR 2-DIMENSIONAL FORWARD ERROR CORRECTION CODING

CROSS REFERENCE TO RELATED APPLICATIONS

This application claims the benefit of U.S. Provisional Application No. 61/751,757, filed Jan. 11, 2013 and to U.S. Provisional Application No. 61/800,425, filed Mar. 15, 2013. The entirety of each of these applications is incorporated herein by reference.

TECHNICAL FIELD

This disclosure relates generally to communication. More particularly, it relates to communication systems capable of 2-dimensional forward error correction (FEC) coding.

BACKGROUND

In a digital communication system, data transmitted may be digital messages originating from a data source, for example a computer server, a mobile device, or a keyboard. The communication channel between the data sources may be unreliable or noisy. Thus, FEC coding or channel coding is introduced to control errors in data transmission. By using FEC, the sender encodes their message in a redundant way by using an error-correcting code (ECC). The redundancy allows the receiver to detect a limited number of errors that may occur anywhere in the message, and often to correct these errors without retransmission.

BRIEF DESCRIPTION OF THE DRAWINGS

The innovation may be better understood with reference to the following drawings and description. In the figures, like reference numerals designate corresponding parts throughout the different views.

DETAILED DESCRIPTION

The description below relates to communication systems and methods for FEC coding. A communication system may adopt analog transmission or digital transmission. While analog transmission is the transfer of a continuously varying analog signal, digital communications is the transfer of discrete messages. In a digital communication system, data is transferred over a point-to-point or point-to-multipoint communication channel. Examples of such channels are copper wires, optical fibers, wireless communication channels, and storage media. The data are represented as an electromagnetic signal, such as an electrical voltage, radio wave, microwave, or infrared signal.

The communication systems usually include an encoder, a decoder or both. The encoder may be configured to implement different coding schemes such as binary product codes, Reed-Solomon (RS) code, turbo code, turbo trellis code modulation (TTCM) code, Low Density Parity Check (LDPC) code, Bose and Ray-Chaudhuri, and Hocquenghem (BCH) code, etc. In practice, almost all enhanced FEC codes used in 10 Gbps and beyond OTN (optical transport network) products are product codes. The disclosed communication system may be modified slightly to implement different coding schemes.

Figure 1:
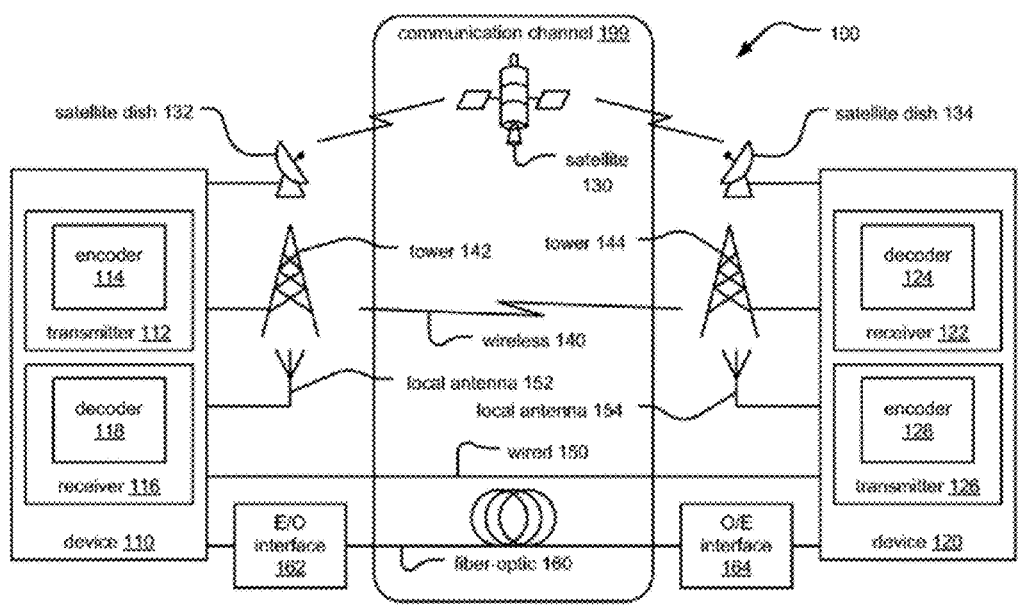
FIG. 1 and FIG. 2 show various embodiments of communication systems.
Figure 2:
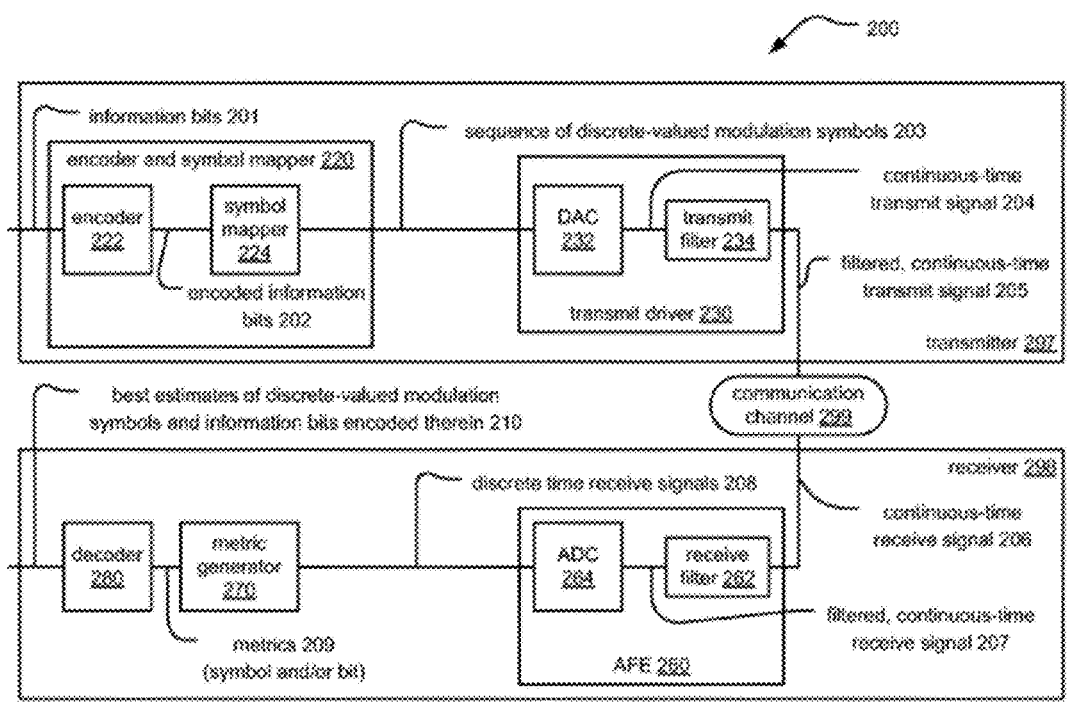

FIG. 1 and FIG. 2 illustrate various embodiments of communication systems including communicating devices with encoders and decoders.

FIG. 1 shows one example of a communication system 100 with a communication channel 199 that communicatively couples a communication device 110 situated at one end of the communication channel 199 to another communication device 120 at the other end of the communication channel 199. The communication device 100 includes a transmitter 112 having an encoder 114 and including a receiver 116 having a decoder 118. The communication device 120 includes a transmitter 126 having an encoder 128 and including a receiver 122 having a decoder 124. In some embodiments, either of the communication devices 110 and 120 may only include a transmitter or a receiver. Also, either of the communication devices 110 and 120 may include multiple transmitters or receivers. There are several different types of media by which the communication channel 199 may be implemented (e.g., a satellite communication channel 130 using satellite dishes 132 and 134, a wireless communication channel 140 using towers 142 and 144 and/or local antennae 152 and 154, a wired communication channel 150, and/or a fiber-optic communication channel 160 using electrical to optical (E/O) interface 162 and optical to electrical (O/E) interface 164)). In addition, more than one type of media may be implemented and interfaced together thereby forming the communication channel 199.

The encoder 114 or 124 is configured to encode source data and output an encoded frame including a plurality of rows and a plurality of columns. The plurality of rows includes a row component code and the plurality of columns includes a column component code. The row component code is configured to achieve a lower bit error rate than the column component code in communication channels having a same signal to noise ratio. Alternatively or additionally, the row component code is configured to achieve higher coding gain or higher error correction capability than the column component code in an optical transport network. The encoded frame is then sent to the communication channel 199 for transmitting. The row component code may include at least one row in the encoded frame and the column component code may include a single column in the encoded frame.

Once the receiver 116 or 126 receives the transmitted data, the decoder 118 or 128 is configured to output a block of decoded data based on the encoded frame comprising a plurality of rows and a plurality of columns. The decoder is configured to perform row decoding only in a low latency mode and perform both row decoding and column decoding in a high latency mode. The row component code is stronger than the column component code in terms of error correcting capability.

To reduce transmission errors that may undesirably be incurred within a communication system, error correction and channel coding schemes are often employed. Generally, these error correction and channel coding schemes involve the use of an encoder at the transmitter and a decoder at the receiver.

Any of the various types of coding described herein can be employed within any such desired communication system (e.g., including those variations described with respect to FIG. 1), any information storage device (e.g., hard disk drives (HDDs), network information storage devices and/or servers, etc.) or any hardware or software application in which information encoding and/or decoding is desired.

FIG. 2 shows one example of a communication system 200 including a transmitter 297 and a receiver 298 communicating through a communication channel 299. The transmitter 297 encodes information bits 201 in an encoder 222 and a symbol mapper 224 thereby generating a sequence of discrete-valued modulation symbols 203. After encoding, the sequence of discrete-valued modulation symbols 203 is provided to a transmit driver 230 that uses a DAC (Digital to Analog Converter) 232 to generate a continuous-time transmit signal 204 and a transmit filter 234 to generate a filtered, continuous-time transmit signal 205 that substantially comports with the communication channel 299. The transmit driver 230 may perform any necessary front end processing of a signal received from a communication channel (e.g., including any one or digital to analog conversion, gain adjustment, filtering, frequency conversion, etc.) to generate the filtered, continuous-time transmit signal 205.

At a receiving end of the communication channel 299, the receiver 298 receives continuous-time receive signal 206. The receiver 298 includes an Analog Front End (AFE) 260 that includes a receive filter 262 and an Analog to Digital Converter (ADC) 264. The receiver filter 262 outputs a filtered, continuous-time receive signal 207 to the ADC that generates discrete-time receive signals 208. The AFE 260 may perform any necessary front end processing of a signal received from a communication channel including any one of analog to digital conversion, gain adjustment, filtering, frequency conversion, etc. to generate a digital signal provided to a metric generator 270 that generates a plurality of metrics corresponding to a particular bit or symbol extracted from the received signal. The metric generator 270 calculates metrics 209 that are employed by a decoder 280 to make best estimates of the discrete-valued modulation symbols and information bits encoded therein 210.

The encoders and decoders of either of the previous embodiments may be implemented to include various aspects and/or embodiment of the disclosure therein. In addition, several of the following figures describe other and particular embodiments that may be used to support the devices, systems, functionality and/or methods that may be implemented in accordance with certain aspects of the disclosure.

Various types of error correction codes (ECGs) may be employed herein. For example, any one or more of any type or variant of Reed-Solomon (RS) code, turbo code, turbo trellis code modulation (TTCM) code, Low Density Parity Check (LDPC) code, Bose and Ray-Chaudhuri, and Hocquenghem (BCH) code, etc. Moreover, as will be illustrated in various embodiments herein, more than one ECC and/or more than one type of ECC may be employed when generating a single encoded signal in accordance with the principles presented herein. For example, certain of the embodiments presented herein operate as product codes, in which an ECC is employed more than once or more than one type of ECC is employed (e.g., a first ECC during a first time and a second ECC at a second time) to generate an encoded signal.

Moreover, both systematic encoding and non-systematic encoding may be performed in accordance with the various principles presented herein. Systematic encoding preserves the information bits being encoded and generates corresponding redundancy/parity bits (i.e., redundancy and parity may be used interchangeably herein); for example, the information bits being encoded are explicitly shown/represented in the output of non-systematic encoding. Non-systematic encoding does not necessarily preserve the information bits being encoded and generates coded bits that inherently include redundancy parity information therein; for example, the information bits being encoded need not be explicitly shown/represented in the output of non-systematic encoding. While many of the embodiments shown herein refer to systematic encoding, it is note that non-systematic encoding may alternatively, be performed in any embodiment without departing from the scope and spirit of the disclosure.

Certain embodiments of communication device and methods operating in accordance with the principles presented herein are designed to maximize coding gain as high as possible while maintaining a reasonable or acceptable hardware complexity and power consumption. Moreover, certain embodiments (e.g., to be compliant in accordance with a certain standard or communication protocol), certain constraints such as bit error rate (BER) or block error rate (BLER), redundancy rate or code rate, bit rates, throughput, etc. For example, one embodiment that operates in accordance with a 100 Giga-bits per second (Gbps) bit rate.

For a high-speed network in the communication systems in FIG. 1 or 2, it may be desired to define a FEC code that can provide different tradeoffs between coding gain and processing latency for different communication channels or different applications.

Figure 3:
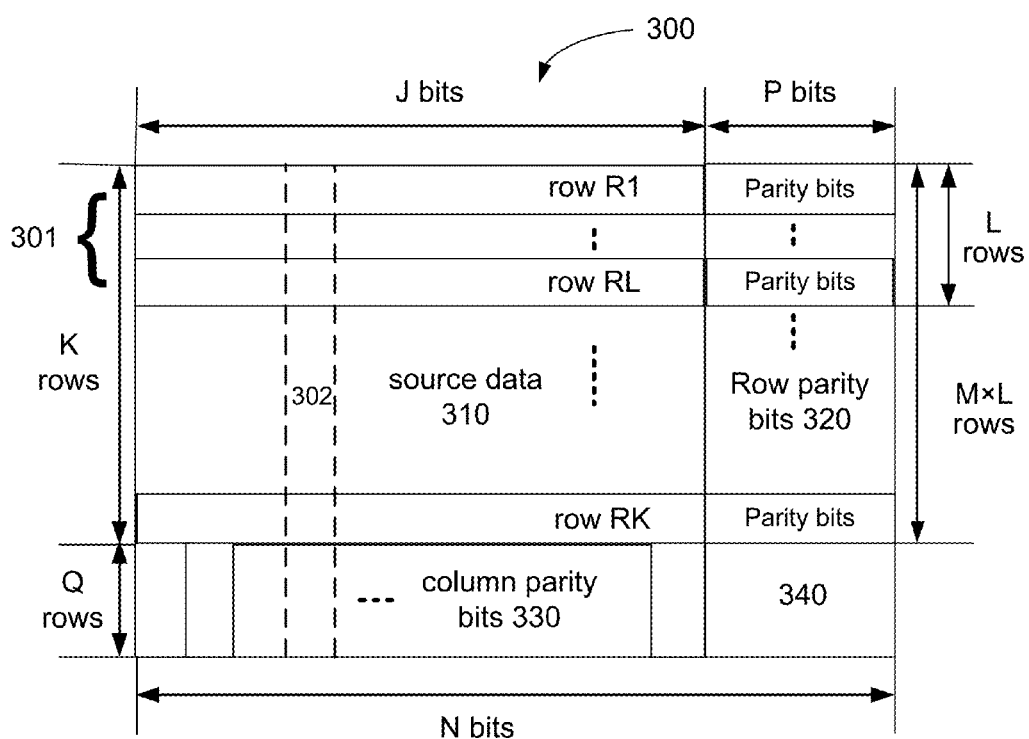
FIG. 3 is a block diagram of an example of a coded frame.

This disclosure discloses a class of pseudo-product codes (psPC) to achieve the tradeoffs. The psPC may be based on BCH codes. For example, FIG. 3 discloses a psPC coded frame 300 that includes M row component codes 301 and N column component codes 302. The coded frame may also be called as a code matrix in this paper. The row component code may be called row code and the column component code may be called column code in this disclosure. Each of M (M>1) row codes 301 includes L (L>1) rows in the code matrix, each of N (N>1) column codes 302 includes exactly one column in the code matrix. L may be an integer in some embodiments and a mixed number in other embodiments. Thus, a row code 301 may include a fraction of a row. The row component code 301 is configured to achieve a lower bit error rate than the column component code 302 in communication channels having a same signal to noise ratio.

The psPC code matrix frame 300 includes source data 310 that includes K rows and J columns source data. The psPC code matrix frame 300 includes row parity bits 320 generated by row encoders and column parity bits 330 generated by column encoders. The parity of parity bits 340 are generated by column encoders.

Figure 4:
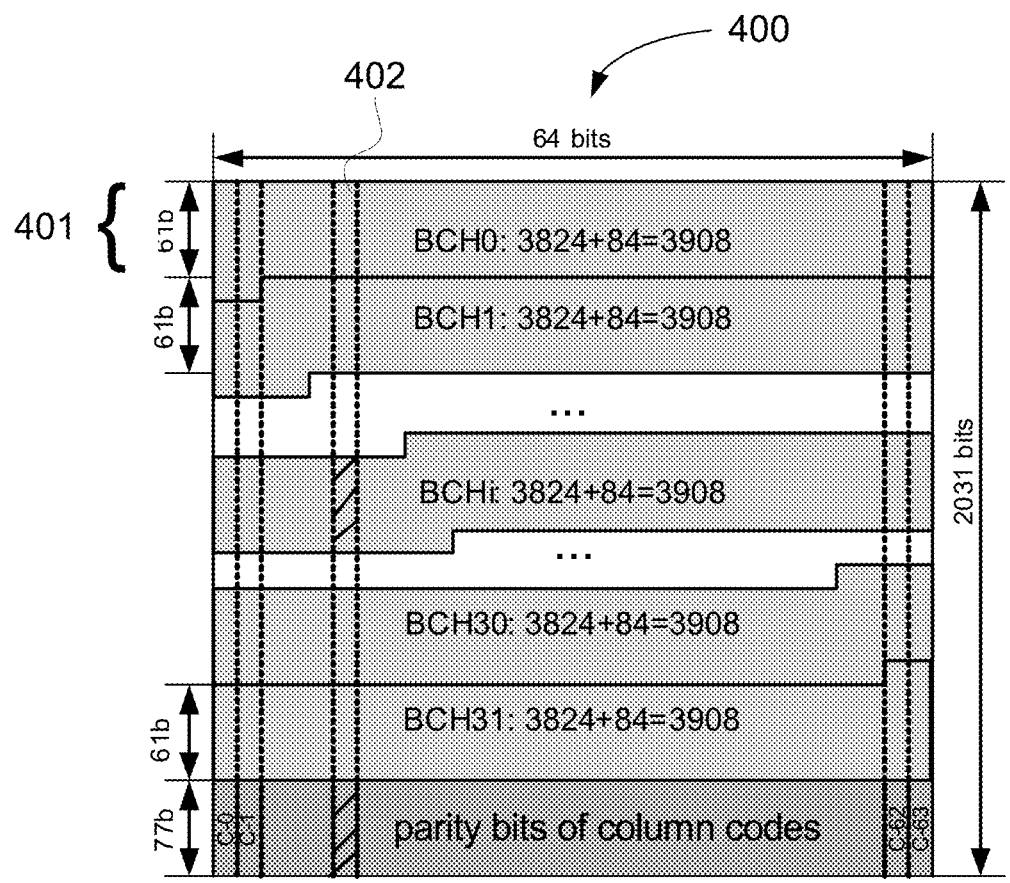
FIG. 4 is a block diagram of another example of a coded frame.

FIG. 4 discloses a code matrix 400 of an example psPC. The psPC code matrix 400 includes 2031 rows and 64 columns. The 2031 rows includes a row code 401, where the row code 401 is selected as BCH(3908, 3824, t=7). The 64 columns include a column code 402, where the column code 402 is selected as BCH(2031, 1954, t=7). In this example, each row code 401 includes 60 to 61 rows in the code matrix 400.

Other codes may be used as row codes or column codes in the communication systems. For 100 G optical networking (IEEE P802.3bm), a true product code (trPC) BCH(154, 130, t=3, m=8)×BCH(152, 128, t=3, m=8) may be used. This trPC can provide a coding gain around 12 dB at target bit-error-rate (BER) of 1e-15.

Similarly, a psPC may be defined as BCH(314, 260, t=6)× BCH(152, 128, t=3). Each row code of this psPC covers two rows in the code matrix. A psPC code may be created such that each row code includes more than two rows in the code matrix.

One of the advantages of such a psPC is that it inherently provides tradeoffs between coding gain and processing latency at receiver side. For example, when the decoder uses iterative decoding method for normal product codes, the BCH (314, 260)×BCH(152, 128) code can achieve a coding gain of around 12 dB. However, the combined encoding and decoding latency may be 300 ns or more with 40 nm CMOS technology. The decoder may be configured to only perform row decoding at receiver side so that the overall FEC-related latency may be less than 100 ns. The coding gain is about 7.6 dB.

Thus, the end users can play different tradeoff for different applications using a decoder configured to decode such psPCs. For good channels with relatively high signal to noise ratio (SNR), the decoder is configured to perform row decoding to achieve low latency while still meeting BER requirement. For bad channels with relatively low SNR, the decoder may sacrifice latency to obtain significantly higher coding gain to meet target BER requirement by performing both row decoding and column decoding in an iterative way.

Note that the above mentioned psPC code has a redundancy ratio (RR) of 43%. The RR may be reduced by increasing column code length, e.g., use BCH(168,144, t=3) as column code. In this case, the RR becomes 40.9%. However, the code size is increased by about 10%. Thus decoding latency will be increased. Similarly the trPC BCH(154, 130)×BCH (152, 128) may be modified to achieve different tradeoffs. For instance, the latency can be traded off for lower RR. An example code is BCH(154, 130)×BCH(168, 144, t=3).

The row code length or the column length may be further increased to decrease RR even further. This may cause two effects: 1) lower coding gain, 2) longer processing latency. A typical case is BCH(219,195, t=3)×BCH(216, 192, t=3). This trPC has a RR of 26.35%. But this code is almost twice as long as original trPC. Similarly, a psPC can be defined with similar RR: BCH(444,390,t=6)×BCH(216, 192, t=3). This psPC has a RR of 28%.

On the other hand, the RR is increased to reduce the code length of the component codes. For instance, a trPC may be chosen as BCH(124, 103, t=3)×BCH(122, 101, t=3). At least one extra redundant bit may be added to each component code to improve decoding performance. The extra redundant bit may include one parity bit in each row code and each column code. Then we have BCH(125, 101, t=3)×BCH(123, 101, t=3). This code has a RR of 53.2%.

In some embodiments, each component code may be shorted to create a code like BCH(92, 70, t=3)×BCH(90, 68, t=3). This code has a RR of 75.2%. Note in a real application, a certain number of dummy bits may be added at the input side of a product code encoder to meet a specified data rate.

Finally, more than one parity bit may be added to some component codes. For instance, an encoder can be configured to multiply a component BCH code generate polynomial with a specified degree-3 polynomial, e.g., $x^3+x+1$ or $x^3+x^2+x+1$ to add 3 extra parity bits to original component code. For example, if a total of 3 extra parity bits are added to each row code in addition to the required parity bits for BCH(t=3) code, the encoder can generate a trPC code such as BCH(90, 66, t=3)×BCH(92, 70, t=3). Similarly, the encoder can be configured to generate a trPc such as BCH(92, 68, t=3)×BCH(90, 68, t=3) and BCH(92, 69, t=3)×BCH(90, 67, t=3).

Certain amount of dummy bits may be added at the input side of encoder. For instance, 60 dummy bits may be added for the trPC code BCH(90, 66, t=3)×BCH(92, 70, t=3), then source data length per FEC block becomes 66×70−60=4560 bits. On the other hand, extra parity bits may be added after normal product code encoding. Similarly, CRC checksums may be added to the whole encoded data or after a few column codes encoding. For example, 10 bits of CRC checksums may be added to the whole encoded data, 2 parity bits may be added for every 4 or 5 encoded column codes, et al.

Similar psPC codes may be constructed for the above discussed shortened trPC codes. For instance, a psPC code may be constructed such as BCH(180, 132, t=6)×BCH(92, 70, t=3) and BCH(368, 269, t=11)×BCH(90, 68, t=3).

When an iterative decoding method based on alternate row decoding and column decoding is employed, a product code may have an error floor issue, where the output BER does not decrease much once SNR gets larger than a certain value. In one embodiment for a trPC code, the error floor may be further reduced. The trPC code may include a row code BCH (t=m) and a column code BCH(t=n), wherein both m and n are integers. If the total number of un-decodable row codes is no more than 2n+1, the decoder may flip all the cross data points between those un-decodable column codes and un-decodable row codes for those un-decodable column codes after the current column decoding phase. Then the decoder may finish the iterative decoding with one more column phase decoding.

Similarly, If the total number of un-decodable column codes is no more than 2m+1, the decoder may flip the bit values of all the cross data points between un-decodable row codes (i.e., un-decodable after the current row decoding phase) and un-decodable column codes for those un-decodable row codes. For example, the decoder may change a "0" to "1" or change a "1" to "0" for all the cross data points. Then the decoder may finish the iterative decoding with one more phase of row decoding.

A trPC may not include any extra parity bits in each component code. For instance, a trPC code based on BCH(986, 956, t=3) and BCH(926, 896, t=3) may be used for OTN applications. The trPC code may include 884 dummy bits while including no extra parity bits for each component code. Accordingly, the trPC code has a size of exactly seven OTU frames and the redundancy ratio is exactly 16/239=6.69%.

Figure 5:
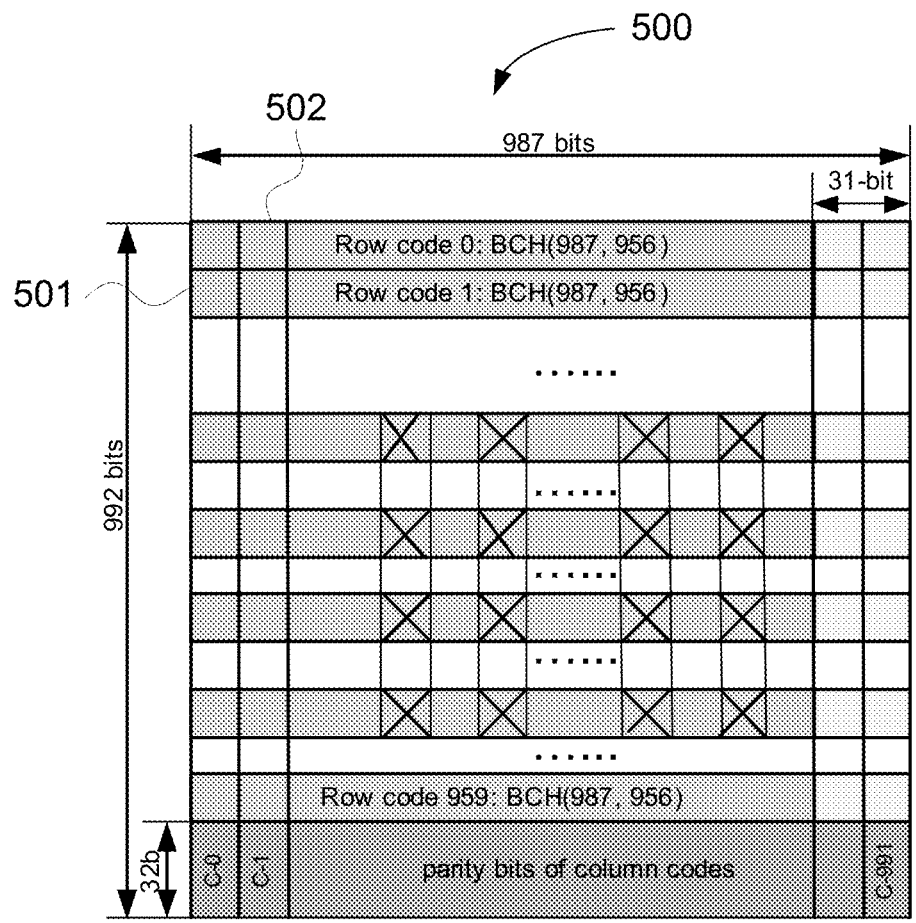
FIG. 5 is a block diagram of yet another example of a coded frame.

FIG. 5 is a block diagram of yet another example of a coded frame 500. The coded frame 500 includes a special true (binary) product code: the SP-BCH (called super-product BCH) code for 100 Gbps applications. The SP-BCH code includes a plurality of rows and a plurality of columns with each row includes a single row code 501 and each column includes a single column code 502. In FIG. 5, the code matrix includes 960 BCH(987, 956, t=3) (1-bit extended) codes as row codes and 987 BCH(992, 960, t=3) (2-bit extended) codes as column codes. The most likely dead pattern is determined to be the 4×4 square error pattern, where 16 bits errors are located in the cross points between 4 arbitrary row codes and 4 arbitrary columns codes. Switching row codes with column codes leads to another version of implementation of SP-BCH code.

Figure 6:
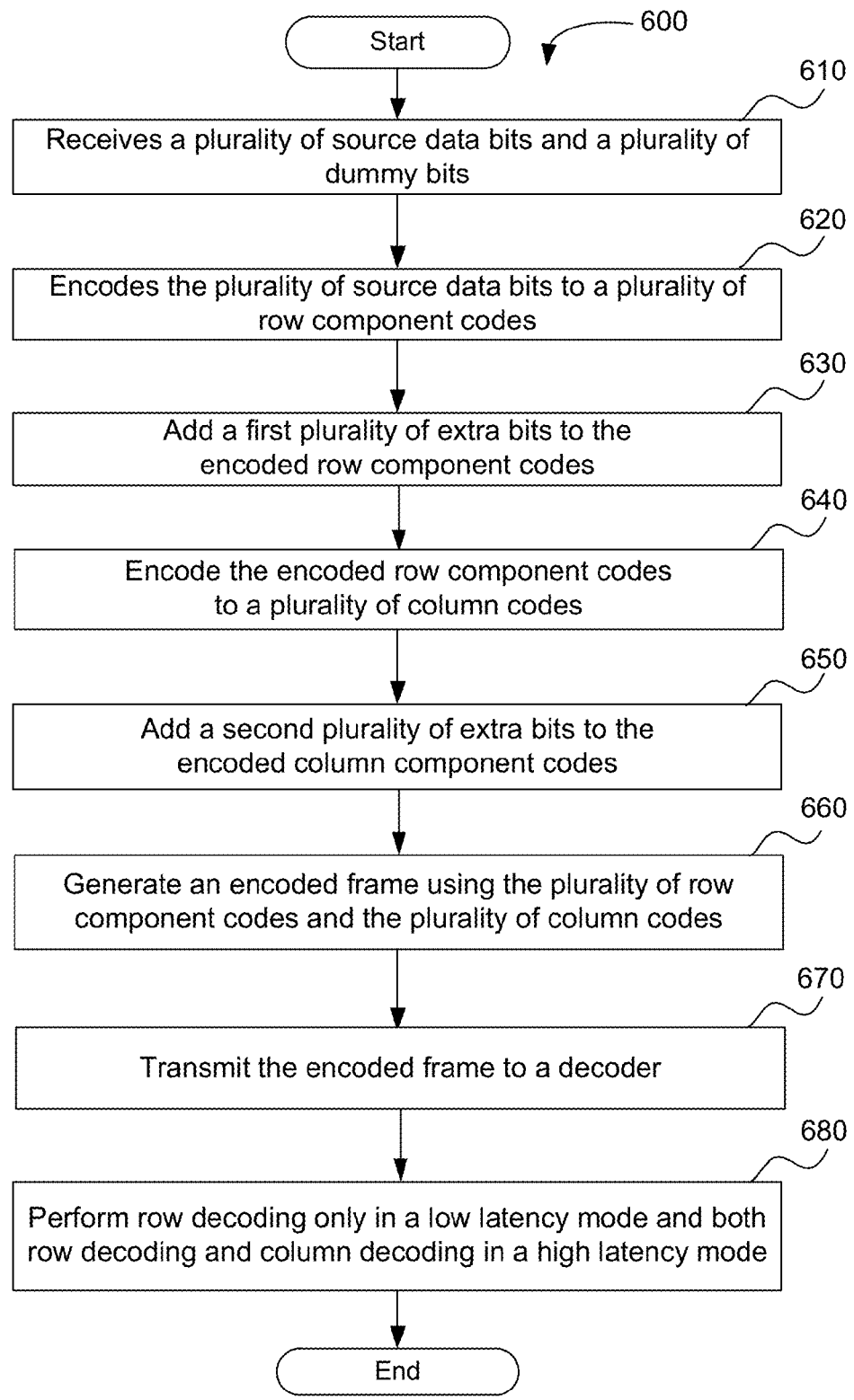
FIG. 6 a block diagram of an example of a block diagram of a method in accordance with embodiments of FEC coding.

FIG. 6 is a block diagram of an example of a block diagram 600 of a method in accordance with embodiments of 2-dimensional FEC coding. In this method, an encoder includes at least a row encoder and a column encoder. The row encoder receives a plurality of source data bits (610). The row encoder is configured to encode the source data using the above BCH codes or other appropriate codes based on the specific application.

The row encoder is configured to encode the plurality of source data bits to a plurality of row component codes (620). For example, the row encoder may use a triple error correcting BCH codes as the row codes. At least one dummy bit may be added in the source data part before encoding to meet a specified communication data rate. A dummy bit can be any predefined bit or generated based on all or partial source input data in the FEC block.

After row encoding, the encoder may add at least one extra parity bit to the encoded row component codes (630). The extra parity bits are added to improve decoding performance. The encoder may also add at least one extra parity bit to the encoded column component codes (650). In practice, those extra parity bits can be generated together with regular parity bits of a component code.

The column encoder is configured to encode the encoded row component codes to a plurality of column codes (640). This includes generating the parity of parity bits based on the row parity bits.

After encoding the row component codes and the column component codes, the encoder generates an encoded frame using the plurality of row component codes and the plurality of column codes (660). Again, a few extra bits may be added to the whole encoded data frame. The encoded data frame is then transmitted to a decoder (670) via a communication channel. The decoder is configured to perform row decoding only in a low latency mode and both row decoding and column decoding in a high latency mode (680). The decoder is configured to perform extra operations to reduce the error floor. For example, the decoder may flip the bit values of all the cross data points between un-decodable row codes and un-decodable column codes for un-decodable row codes if the total number of un-decodable column codes is less than a certain value, e.g., (2t+2), where t is the error correcting capability of the row component code. Similarly, the decoder may flip the bit values of all the cross data points between un-decodable row codes and un-decodable column codes (i.e., un-decodable after the current column decoding phase) for those remaining un-decodable column codes if the total of un-decodable row codes is less than a certain value, e.g., (2t+2), where t is the error correcting capability of the column component code.

In an embodiment, the row component code and the column component code includes a triple error correcting Bose and Ray-Chaudhuri, and Hocquenghem (BCH) code: BCH (t=3). The row component code may include only one row in the encoded frame and the column component code comprises only one column in the encoded frame.

The methods, devices, and logic described above may be implemented in many different ways in many different combinations of hardware, software or both hardware and software. For example, all or parts of the apparatus may include circuitry in a controller, a microprocessor, or an application specific integrated circuit (ASIC), or may be implemented with discrete logic or components, or a combination of other types of analog or digital circuitry, combined on a single integrated circuit or distributed among multiple integrated circuits. All or part of the apparatus described above may be implemented as instructions for execution by a processor, controller, or other processing device and may be stored in a tangible or non-transitory machine-readable or computer-readable medium such as flash memory, random access memory (RAM) or read only memory (ROM), erasable programmable read only memory (EPROM) or other machine-readable medium such as a compact disc read only memory (CDROM), or magnetic or optical disk. Thus, a product, such as a computer program product, may include a storage medium and computer readable instructions stored on the medium, which when executed in an endpoint, computer system, or other device, cause the device to perform operations according to any of the description above.

The processing capability described above may be distributed among multiple system components, such as among multiple processors and memories, optionally including multiple distributed processing systems. Parameters, databases, and other data structures may be separately stored and managed, may be incorporated into a single memory or database, may be logically and physically organized in many different ways, and may be implemented in many ways, including data structures such as linked lists, hash tables, or implicit storage mechanisms. Programs may be parts (e.g., subroutines) of a single program, separate programs, distributed across several memories and processors, or implemented in many different ways, such as in a library, such as a shared library (e.g., a dynamic link library (DLL)). The DLL, for example, may store code that performs any of the system processing described above.

While various embodiments of the systems and methods have been described, it will be apparent to those of ordinary skill in the art that many more embodiments and implementations are possible within the scope of the systems and methods. Accordingly, the systems and methods are not to be restricted except in light of the attached claims and their equivalents.

What is claimed is:

1. A communication system, comprising:
an encoder configured to:
encode source data; and
output an encoded frame comprising:
a plurality of rows including at least one row component code encoded according to a first error correction code; and
a plurality of columns with at least one of the columns including a column component code encoded according to a second error correction code,
wherein the first and second error correction codes are characterized by different error correcting capabilities, with the row component code capable of achieving a lower bit error rate than the column component code for a given predetermined signal to noise ratio.

2. The communication system of claim 1, wherein the encoder is configured to add at least one extra bit to either the row component code, or the column component code, or both the row component code and the column component code.

3. The communication system of claim 2, wherein the at least one extra bit comprises an extra redundant bit, an extra parity bit, or any combination thereof.

4. The communication system of claim 2, wherein the encoder is configured to meet a specified data rate by adding at least one dummy bit to the source data before encoding at least one of the row component code and column component code.

5. The communication system of claim 1, wherein the row component code comprises at least one row in the encoded frame and the column component code comprises a single column in the encoded frame.

6. The communication system of claim 1, wherein the row component code comprises an integer number of rows in the encoded frame.

7. The communication system of claim 1, wherein the row component code comprises a single row in the encoded frame and the column component code comprises a single column in the encoded frame.

8. The communication system of claim 1, wherein the row component code is configured to achieve higher coding gain or higher error correction capability, or both than the column component code where the row component code and the column component code employ different Bose and Ray-Chaudhuri, and Hocguenghem (BCH) codes.

9. A communication system, comprising:
a decoder configured to output a block of decoded data based on an encoded frame comprising:

a plurality of rows including at least one row component code encoded according to a first error correction code; and a plurality of columns with at least one of the columns including a column component code encoded according to a second error correction code, wherein the decoder is configured to perform row decoding without column decoding in a first latency mode and perform both row decoding and column decoding in a second latency mode based on a preset tradeoff between coding gain and processing latency.

10. The communication system of claim 9, wherein the decoder is configured to perform row decoding only in the first latency mode based on at least one of the following: a channel condition threshold and a coding gain threshold.

11. The communication system of claim 9, wherein the decoder is configured to remove dummy bits added at an input side of an encoder to meet a specified data rate.

12. The communication system of claim 9, wherein:
the decoder is further configured to reduce error floor of binary product codes;
when a total number of un-decodable row codes is less than a preset value, the decoder flips all data bits on the cross points between un-decodable row codes and un-decodable column codes and then performs one more phase of column decoding, and
when a total number of un-decodable column codes is less than the preset value, the decoder flips all the data bits on the cross points between un-decodable row codes and un-decodable column codes and then performs one more phase of row decoding.

13. The communication system of claim 12, wherein the preset value comprises 2t+2 and t represents an error correcting capability of a component code at a next decoding phase.

14. The communication system of claim 9, wherein the row component code is stronger than the column component code in terms of error correcting capability by employing the first and second error correction codes characterized by different error correcting capabilities.

15. The communication system of claim 9, wherein the row component code comprises an integer number of rows in the encoded frame.

16. The communication system of claim 9, wherein the row component code comprises a single row in the encoded frame and the column component code comprises a single column in the encoded frame.

17. A communication method, comprising:
receiving, in a row encoder, a plurality of source data bits and at least one dummy bit to meet a specified data rate;
encoding, by the row encoder, the plurality of source data bits to a plurality of row component codes;
adding first number of extra bits to the plurality of row component codes to generate encoded row component codes;
encoding, by a column encoder, the encoded row component codes to a plurality of column component codes;
adding second number of extra bits to the plurality of column component codes to generate encoded column component codes; and
generating an encoded frame using the plurality of encoded row component codes and the plurality of encoded column component codes,
wherein the row component code and the column component code were encoded, respectively, by first and second error correction codes characterized by different error correcting capabilities, with the row component code capable of achieving a lower bit error rate than the column component code for a given predetermined signal to noise ratio.

18. The communication method of claim 17, further comprising:
transmitting the encoded frame to a decoder; and
performing, by the decoder, row decoding without column decoding in a first latency mode and both row decoding and column decoding in a second latency mode based on a preset tradeoff between coding gain and processing latency, wherein the second latency mode is characterized by latency higher than in the first latency mode.

19. The communication method of claim 18, wherein:
the row component code and the column component code comprise a triple error correcting Bose and Ray-Chaudhuri, and Hocquenghem (BCH) code: BCH (t=3);
the row component code comprises only one row in the encoded frame and the column component code comprises only one column in the encoded frame.

20. The communication method of claim 17, wherein the row component code is stronger than the column component code in terms of error correcting capability by employing the first and second error correction codes characterized by different error correcting capabilities.

* * * * *